(12) United States Patent
Rhee

(10) Patent No.: US 11,387,396 B2
(45) Date of Patent: Jul. 12, 2022

(54) DISPLAY APPARATUS USING SEMICONDUCTOR LIGHT EMITTING DEVICE

(71) Applicant: LG ELECTRONICS INC., Seoul (KR)

(72) Inventor: Byungjoon Rhee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 19 days.

(21) Appl. No.: 16/962,325

(22) PCT Filed: Feb. 1, 2018

(86) PCT No.: PCT/KR2018/001384
§ 371 (c)(1),
(2) Date: Jul. 15, 2020

(87) PCT Pub. No.: WO2019/142965
PCT Pub. Date: Jul. 25, 2019

(65) Prior Publication Data
US 2020/0343426 A1 Oct. 29, 2020

(30) Foreign Application Priority Data
Jan. 16, 2018 (KR) .......................... 10-2018-0005731

(51) Int. Cl.
*H01L 33/62* (2010.01)
*H01L 33/48* (2010.01)
(Continued)

(52) U.S. Cl.
CPC ............ *H01L 33/62* (2013.01); *H01L 33/486* (2013.01); *H01L 33/502* (2013.01); *H01L 33/60* (2013.01)

(58) Field of Classification Search
CPC ..... H01L 33/62; H01L 33/486; H01L 33/502; H01L 33/60; H01L 25/0753; H01L 33/50; H01L 27/156
See application file for complete search history.

(56) References Cited

U.S. PATENT DOCUMENTS

2008/0309224 A1* 12/2008 Kwak ................. H01L 27/3246
313/504
2015/0362165 A1* 12/2015 Chu ...................... H01L 27/156
362/235
(Continued)

FOREIGN PATENT DOCUMENTS

JP          2013-219398 A    10/2013
KR    10-2013-0087160 A     8/2013
(Continued)

*Primary Examiner* — Jonathan Han
(74) *Attorney, Agent, or Firm* — Birch, Stewart, Kolasch & Birch, LLP

(57) ABSTRACT

Discussed is a display apparatus and, more particularly, to a display apparatus using a semiconductor light emitting device. A display apparatus includes a substrate having a first wiring; a rib portion provided with a first rib and a second rib formed to protrude from one surface of the substrate, the first and second ribs disposed on opposite sides of the first wiring; a solderable metal filled between the first rib and the second rib, and formed to cover the first wiring; and a plurality of semiconductor light emitting devices sequentially arranged along the rib portion, at least part of the plurality of semiconductor light emitting devices are inserted into the solderable metal to be electrically connected to the first wiring.

20 Claims, 13 Drawing Sheets

(51) Int. Cl.
 *H01L 33/50* (2010.01)
 *H01L 33/60* (2010.01)

(56) References Cited

U.S. PATENT DOCUMENTS

| | | | | |
|---|---|---|---|---|
| 2016/0201875 A1* | 7/2016 | Kang | ................ | G02B 19/0061 |
| | | | | 362/311.06 |
| 2017/0038015 A1* | 2/2017 | Lunz | ........................ | F21K 9/64 |
| 2017/0194304 A1* | 7/2017 | Takeya | .................. | H01L 25/162 |
| 2017/0287887 A1* | 10/2017 | Takeya | .................. | H01L 25/167 |

FOREIGN PATENT DOCUMENTS

| | | |
|---|---|---|
| KR | 10-1521939 B1 | 5/2015 |
| KR | 10-2017-0022756 A | 3/2017 |
| KR | 10-2017-0024905 A | 3/2017 |
| WO | WO 2013/024916 A1 | 2/2013 |
| WO | WO 2017/034268 A1 | 3/2017 |
| WO | WO 2018/004107 A1 | 1/2018 |

\* cited by examiner

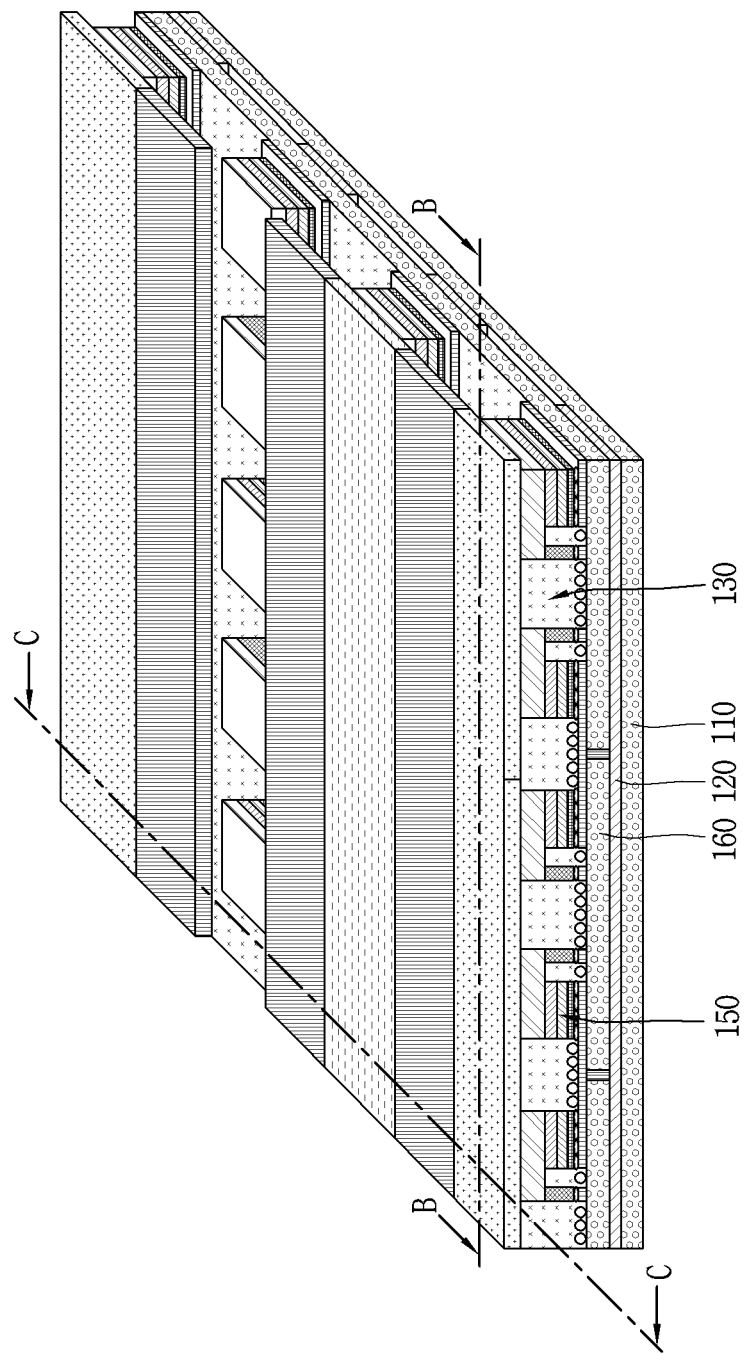

DISPLAY APPARATUS USING SEMICONDUCTOR LIGHT EMITTING DEVICE

CROSS-REFERENCE TO RELATED APPLICATIONS

This application is the National Stage filing under 35 U.S.C. 371 of International Application No. PCT/KR2018/001384, filed on Feb. 1, 2018, which claims the benefit of earlier filing date and right of priority to Korean Patent Application No. 10-2018-0005731, filed on Jan. 16, 2018, the contents of all these applications are all hereby incorporated by reference herein in their entirety.

BACKGROUND

1. Technical Field

The present disclosure relates to a display apparatus, and more particularly, to a display apparatus using a semiconductor light emitting device.

2. Description of the Related Art

In recent years, display apparatuses having excellent characteristics such as low profile, flexibility and the like have been developed in the display technical field. On the contrary, currently commercialized main displays are represented by liquid crystal displays (LCDs) and active matrix organic light emitting diodes (AMOLEDs).

However, there exist problems such as not-so-fast response time, difficult implementation of low profile, flexibility in case of LCDs, and there exist drawbacks such as short life span, not-so-good yield as well as weakness in low profile, flexibility in case of AMOLEDs.

On the other hand, light emitting diodes (LEDs) are well known light emitting devices for converting an electrical current to light, and have been used as a light source for displaying an image in an electronic device including information communication devices since red LEDs using GaAsP compound semiconductors were made commercially available in 1962, together with a GaP:N-based green LEDs. Accordingly, the semiconductor light emitting devices may be used to implement a flexible display, thereby presenting a scheme for solving the problems.

On the other hand, during the implementation of a display apparatus using a semiconductor light emitting device, when connecting a very small semiconductor light emitting device to a wiring, a problem requiring a high degree of difficulty as well as high cost has been continuously raised. Moreover, there also exists difficulty in stably attaching the semiconductor light emitting device as the area becomes larger. Accordingly, in the present disclosure, a display apparatus having a new structure capable of solving the foregoing problems will be proposed.

SUMMARY

An aspect of the present disclosure is to provide a new mechanism capable of transferring a large area in a display apparatus using a semiconductor light emitting device.

Another aspect of the present disclosure is to provide a display apparatus capable of more easily transferring a semiconductor light emitting device to a wiring substrate.

As a means for solving the problem, in the present disclosure, a semiconductor light emitting device may be disposed between structures, and connected to a wiring by filling a solderable metal therein.

More specifically, a display apparatus according to the present disclosure may include a substrate having a lower wiring, a rib portion disposed at both sides of the lower wiring, and provided with a first rib and a second rib formed to protrude from one surface of the substrate, a solderable metal filled between the first rib and the second rib, and formed to cover the lower wiring, and a plurality of semiconductor light emitting devices sequentially arranged along the rib portion, at least part of which are inserted into the solderable metal to be electrically connected to the lower wiring.

According to an embodiment, the display apparatus may include a planarizing layer formed to cover the solderable metal. An upper wiring electrically connected to the semiconductor light emitting devices may be disposed on the planarizing layer.

According to an embodiment, the display apparatus may include a phosphor layer formed to cover the planarizing layer and the semiconductor light emitting devices to convert the wavelength of light. The rib portion may be any one of a plurality of rib portions arranged at predetermined intervals along one direction, and the phosphor layer may extend between the rib portions.

The plurality of rib portions may include a first rib portion and a second rib portion, and a phosphor layer covering the first rib portion may be filled between the first rib portion and the second rib portion. A rib close to the second rib portion between the ribs of the first rib portion may be made of a light transmitting material.

According to an embodiment, either one of the first rib and the second rib may be formed to transmit light, and the other one thereof may be formed to reflect light. The first rib and the second rib may be configured to be symmetrical with respect to the semiconductor light emitting device. A height of the rib portion may be larger than that of the lower wiring with respect to one surface of the substrate.

According to an embodiment, the rib portion may be any one of a plurality of rib portions arranged at predetermined intervals along one direction, and an insulating material may be filled between the rib portions. A phosphor layer for converting the wavelength of light may be formed on an upper surface of the rib portion, and the phosphor layer may extend to cover the insulating material.

According to the present disclosure having the above configuration, a solderable metal may be heated in a liquid phase through a rib portion to insert a semiconductor light emitting device therein so as to complete a wiring, thereby simplifying the process for wiring in a display apparatus.

In addition, as the rib portion is used, the semiconductor light emitting device may be protected during transfer, thereby enabling selective transfer at a low cost. Furthermore, an area distributed with phosphor may be further secured using a transparent rib portion. Through this, the color of light may be converted in a space between the semiconductor light emitting devices.

In addition, according to the present disclosure, the use of an anisotropic conductive film or the like may not be required, thereby reducing cost and preventing instability due to the flow of an adhesive layer during large area attachment.

BRIEF DESCRIPTION OF THE DRAWINGS

FIG. 2 is a partial enlarged view of portion "A" in FIG. 1, and FIGS. 3A and 3B are cross-sectional views taken along lines B-B and C-C in FIG. 2.

DETAILED DESCRIPTION OF THE EMBODIMENTS

Figure 1:
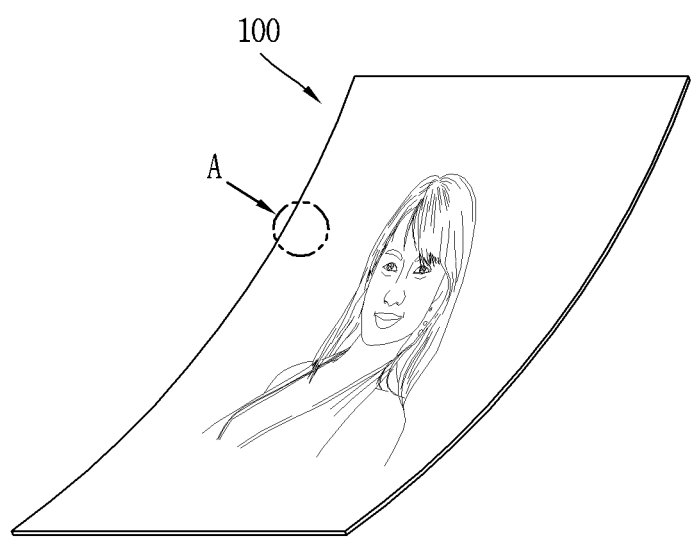
FIG. 1 is a conceptual view showing a display apparatus using a semiconductor light emitting device according to an embodiment of the present disclosure.

Hereinafter, the embodiments disclosed herein will be described in detail with reference to the accompanying drawings, and the same or similar elements are designated with the same numeral references regardless of the numerals in the drawings and their redundant description will be omitted. A suffix "module" and "unit" used for constituent elements disclosed in the following description is merely intended for easy description of the specification, and the suffix itself does not give any special meaning or function. In describing an embodiment disclosed herein, moreover, the detailed description will be omitted when specific description for publicly known technologies to which the invention pertains is judged to obscure the gist of the present disclosure. Also, it should be noted that the accompanying drawings are merely illustrated to easily explain the concept of the invention, and therefore, they should not be construed to limit the technological concept disclosed herein by the accompanying drawings.

Furthermore, it will be understood that when an element such as a layer, region or substrate is referred to as being "on" another element, it can be directly on the another element or an intermediate element may also be interposed therebetween.

A display apparatus disclosed herein may include a portable phone, a smart phone, a laptop computer, a digital broadcast terminal, a personal digital assistant (PDA), a portable multimedia player (PMP), a navigation, a slate PC, a tablet PC, an ultrabook, a digital TV, a desktop computer, and the like. However, it would be easily understood by those skilled in the art that a configuration disclosed herein may be applicable to any displayable device even though it is a new product type which will be developed later.

FIG. 1 is a conceptual view showing a display apparatus using a semiconductor light emitting device according to an embodiment of the present disclosure.

According to the drawing, information processed in the controller of the display apparatus 100 may be displayed using a flexible display.

The flexible display may include a flexible, bendable, twistable, foldable and rollable display. For example, the flexible display may be a display fabricated on a thin and flexible substrate that can be warped, bent, folded or rolled like a paper sheet while maintaining the display characteristics of a flat display in the related art.

A display area of the flexible display becomes a plane in a configuration that the flexible display is not warped (for example, a configuration having an infinite radius of curvature, hereinafter, referred to as a "first configuration"). The display area thereof becomes a curved surface in a configuration that the flexible display is warped by an external force in the first configuration (for example, a configuration having a finite radius of curvature, hereinafter, referred to as a "second configuration"). As illustrated in the drawing, information displayed in the second configuration may be visual information displayed on a curved surface. The visual information may be implemented by individually controlling the light emission of sub-pixels disposed in a matrix form. The sub-pixel denotes a minimum unit for implementing one color.

The sub-pixel of the flexible display may be implemented by a semiconductor light emitting device. According to the present disclosure, a light emitting diode (LED) is illustrated as a type of semiconductor light emitting device. The light emitting diode may be formed with a small size to perform the role of a sub-pixel even in the second configuration through this.

Hereinafter, a flexible display implemented using the light emitting diode will be described in more detail with reference to the accompanying drawings.

Figure 3A:
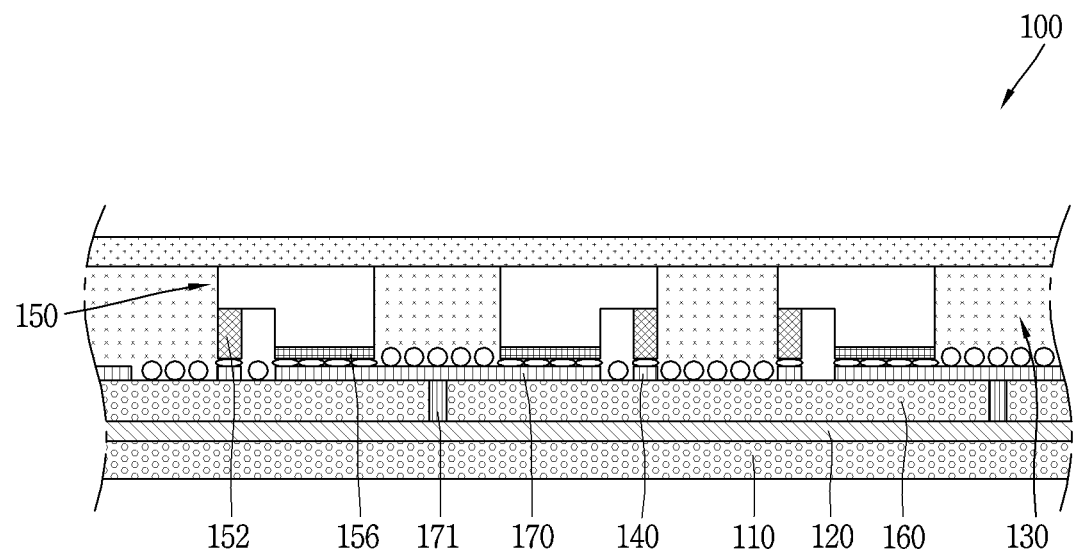
Figure 3B:
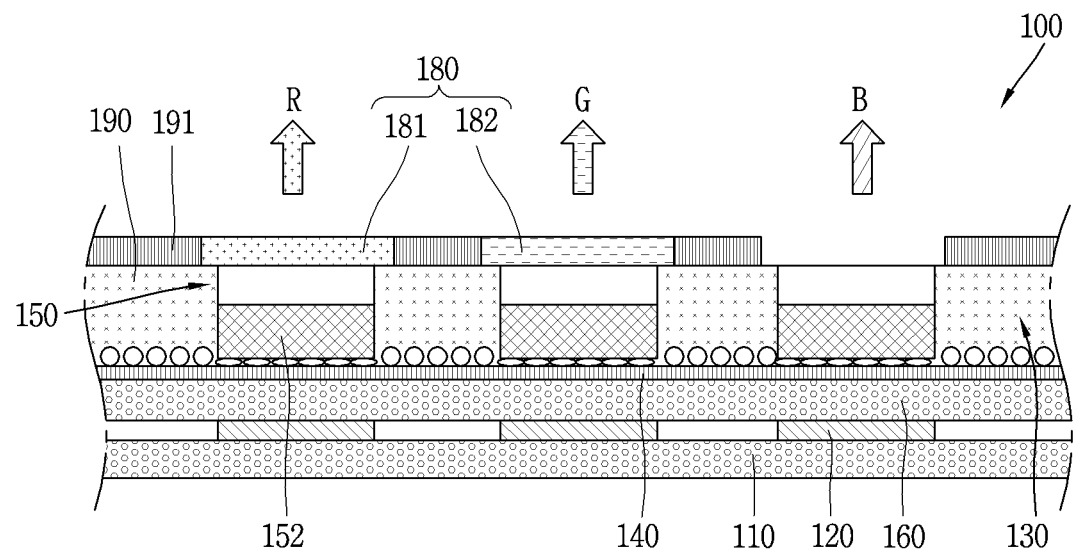
Figure 4:
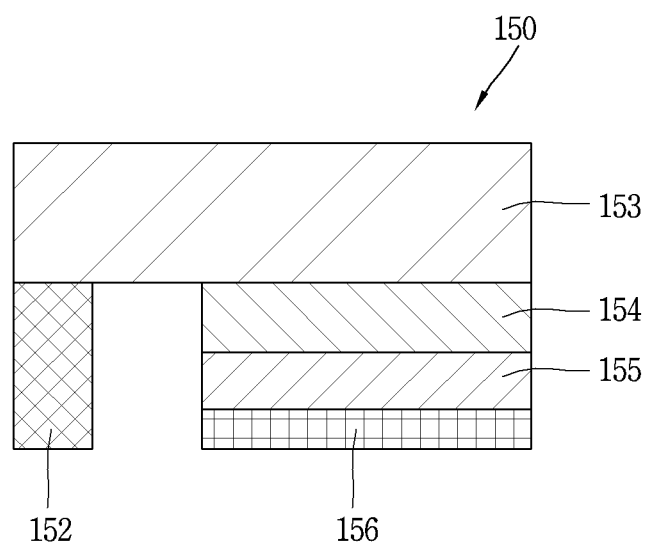
FIG. 4 is a conceptual view showing a flip-chip type semiconductor light emitting device in FIG. 3.

FIG. 2 is a partial enlarged view of portion "A" in FIG. 1, and FIGS. 3A and 3B are cross-sectional views taken along lines B-B and C-C in FIG. 2, FIG. 4 is a conceptual view illustrating a flip-chip type semiconductor light emitting device in FIG. 3A, and FIGS. 5A through 5C are conceptual views illustrating various forms for implementing colors in connection with a flip-chip type semiconductor light emitting device.

According to the drawings in FIGS. 2, 3A and 3B, there is illustrated a display apparatus 100 using a passive matrix (PM) type semiconductor light emitting device as a display apparatus 100 using a semiconductor light emitting device. However, an example described below may also be applicable to an active matrix (AM) type semiconductor light emitting device.

The display apparatus 100 may include a substrate 110, a first electrode 120, a conductive adhesive layer 130, a second electrode 140, and a plurality of semiconductor light emitting devices 150.

The substrate 110 may be a flexible substrate. The substrate 110 may contain glass or polyimide (PI) to implement the flexible display apparatus. In addition, if it is an insulating and flexible material, any one such as polyethylene naphthalate (PEN), polyethylene terephthalate (PET) or the like may be used. Furthermore, the substrate 110 may be either one of transparent and non-transparent materials.

The substrate 110 may be a wiring substrate disposed with the first electrode 120, and thus the first electrode 120 may be placed on the substrate 110.

According to the drawing, an insulating layer 160 may be disposed on the substrate 110 placed with the first electrode 120, and an auxiliary electrode 170 may be placed on the insulating layer 160. In this case, a configuration in which the insulating layer 160 is deposited on the substrate 110 may be a single wiring substrate. More specifically, the insulating layer 160 may be incorporated into the substrate 110 with an insulating and flexible material such as polyimide (PI), PET, PEN or the like to form a single wiring substrate.

The auxiliary electrode 170 as an electrode for electrically connecting the first electrode 120 to the semiconductor light emitting device 150 is placed on the insulating layer 160, and disposed to correspond to the location of the first electrode 120. For example, the auxiliary electrode 170 has a dot shape, and may be electrically connected to the first electrode 120 by means of an electrode hole 171 passing through the insulating layer 160. The electrode hole 171 may be formed by filling a conductive material in a via hole.

Referring to the drawings, the conductive adhesive layer 130 may be formed on one surface of the insulating layer 160, but the present disclosure may not be necessarily limited to this. For example, it may be possible to also have a structure in which the conductive adhesive layer 130 is disposed on the substrate 110 with no insulating layer 160. The conductive adhesive layer 130 may perform the role of an insulating layer in the structure in which the conductive adhesive layer 130 is disposed on the substrate 110.

The conductive adhesive layer 130 may be a layer having adhesiveness and conductivity, and to this end, a conductive material and an adhesive material may be mixed on the conductive adhesive layer 130. Furthermore, the conductive adhesive layer 130 may have flexibility, thereby allowing a flexible function in the display apparatus.

For such an example, the conductive adhesive layer 130 may be an anisotropic conductive film (ACF), an anisotropic conductive paste, a solution containing conductive particles, and the like. The conductive adhesive layer 130 may allow electrical interconnection in the z-direction passing through the thickness thereof, but may be configured as a layer having electrical insulation in the horizontal x-y direction thereof. Accordingly, the conductive adhesive layer 130 may be referred to as a z-axis conductive layer (however, hereinafter referred to as a "conductive adhesive layer").

The anisotropic conductive film is a film with a form in which an anisotropic conductive medium is mixed with an insulating base member, and thus when heat and pressure are applied thereto, only a specific portion thereof may have conductivity by means of the anisotropic conductive medium. Hereinafter, heat and pressure are applied to the anisotropic conductive film, but other methods may be also available for the anisotropic conductive film to partially have conductivity. The methods may include applying only either one of heat and pressure thereto, UV curing, and the like.

Furthermore, the anisotropic conductive medium may be conductive balls or particles. According to the drawing, in the present example, the anisotropic conductive film is a film with a form in which an anisotropic conductive medium is mixed with an insulating base member, and thus when heat and pressure are applied thereto, only a specific portion thereof may have conductivity by means of the conductive balls. The anisotropic conductive film may be in a state in which a core with a conductive material contains a plurality of particles coated by an insulating layer with a polymer material, and in this case, it may have conductivity by means of the core while breaking an insulating layer on a portion to which heat and pressure are applied. Here, a core may be transformed to implement a layer having both surfaces to which objects contact in the thickness direction of the film. For a more specific example, heat and pressure are applied to an anisotropic conductive film as a whole, and electrical connection in the z-axis direction is partially formed by a height difference from a mating object adhered by the use of the anisotropic conductive film.

For another example, an anisotropic conductive film may be in a state containing a plurality of particles in which a conductive material is coated on insulating cores. In this case, a portion to which heat and pressure are applied may be converted (pressed and adhered) to a conductive material to have conductivity in the thickness direction of the film. For still another example, it may be formed to have conductivity in the thickness direction of the film in which a conductive material passes through an insulating base member in the z-direction. In this case, the conductive material may have a pointed end portion.

According to the drawing, the anisotropic conductive film may be a fixed array anisotropic conductive film (ACF) configured with a form in which conductive balls are inserted into one surface of the insulating base member. More specifically, the insulating base member is formed of an adhesive material, and the conductive balls are intensively disposed at a bottom portion of the insulating base member, and when heat and pressure are applied thereto, the base member is modified along with the conductive balls, thereby having conductivity in the vertical direction thereof.

However, the present disclosure may not be necessarily limited to this, and the anisotropic conductive film may be all allowed to have a form in which conductive balls are randomly mixed with an insulating base member or a form configured with a plurality of layers in which conductive balls are disposed at any one layer (double-ACF), and the like.

The anisotropic conductive paste as a form coupled to a paste and conductive balls may be a paste in which conductive balls are mixed with an insulating and adhesive base material. Furthermore, a solution containing conductive particles may be a solution in a form containing conductive particles or nano particles.

Referring again to the drawing, the second electrode 140 is located at the insulating layer 160 to be separated from the auxiliary electrode 170. In other words, the conductive adhesive layer 130 is disposed on the insulating layer 160 located with the auxiliary electrode 170 and second electrode 140.

When the conductive adhesive layer 130 is formed in a state that the auxiliary electrode 170 and second electrode 140 are located, and then the semiconductor light emitting device 150 is connect thereto in a flip chip form with the application of heat and pressure, the semiconductor light emitting device 150 is electrically connected to the first electrode 120 and second electrode 140.

Referring to FIG. 4, the semiconductor light emitting device may be a flip chip type semiconductor light emitting device.

For example, the semiconductor light emitting device may include a p-type electrode 156, a p-type semiconductor layer 155 formed with the p-type electrode 156, an active layer 154 formed on the p-type semiconductor layer 155, an n-type semiconductor layer 153 formed on the active layer 154, and an n-type electrode 152 disposed to be separated from the p-type electrode 156 in the horizontal direction on the n-type semiconductor layer 153. In this case, the p-type electrode 156 may be electrically connected to the welding portion 179 by the conductive adhesive layer 130, and the n-type electrode 152 may be electrically connected to the second electrode 140.

Referring to FIGS. 2, 3A and 3B again, the auxiliary electrode 170 may be formed in an elongated manner in one direction to be electrically connected to a plurality of semiconductor light emitting devices 150. For example, the left and right p-type electrodes of the semiconductor light emitting devices around the auxiliary electrode may be electrically connected to one auxiliary electrode.

More specifically, the semiconductor light emitting device 150 is pressed into the conductive adhesive layer 130, and through this, only a portion between the p-type electrode 156 and auxiliary electrode 170 of the semiconductor light emitting device 150 and a portion between the n-type electrode 152 and second electrode 140 of the semiconductor light emitting device 150 have conductivity, and the remaining portion does not have conductivity since there is no push-down of the semiconductor light emitting device. As described above, the conductive adhesive layer 130 may form an electrical connection as well as allow a mutual coupling between the semiconductor light emitting device 150 and the auxiliary electrode 170 and between the semiconductor light emitting device 150 and the second electrode 140.

Furthermore, a plurality of semiconductor light emitting devices 150 constitute a light-emitting array, and a phosphor layer 180 is formed on the light-emitting array.

The light emitting device array may include a plurality of semiconductor light emitting devices with different self-luminance values. Each of the semiconductor light emitting devices 150 constitutes a sub-pixel, and is electrically connected to the first electrode 120. For example, there may exist a plurality of first electrodes 120, and the semiconductor light emitting devices are arranged in several rows, for instance, and each row of the semiconductor light emitting devices may be electrically connected to any one of the plurality of first electrodes.

Furthermore, the semiconductor light emitting devices may be connected in a flip chip form, and thus semiconductor light emitting devices grown on a transparent dielectric substrate. Furthermore, the semiconductor light emitting devices may be nitride semiconductor light emitting devices, for instance. The semiconductor light emitting device 150 may have excellent luminance characteristics, and thus it may be possible to configure individual sub-pixels even with a small size thereof.

According to the drawing, a partition wall 190 may be formed between the semiconductor light emitting devices 150. The semiconductor light emitting device 150 may have excellent luminance characteristics, and thus it may be possible to configure individual sub-pixels even with a small size thereof. For example, a base member of the anisotropic conductive film may form the partition wall when the semiconductor light emitting device 150 is inserted into the anisotropic conductive film.

Furthermore, when the base member of the anisotropic conductive film is black, the partition wall 190 may have reflective characteristics while at the same time increasing contrast with no additional black insulator.

For another example, a reflective partition wall may be separately provided with the partition wall 190. In this case, the partition wall 190 may include a black or white insulator according to the purpose of the display apparatus. When a partition wall of a white insulator is used, an effect of enhancing reflectivity may be obtained. When a partition wall of a black insulator is used, a contrast ratio may be increased while having a reflection characteristic.

The phosphor layer 180 may be located at an outer surface of the semiconductor light emitting device 150. For example, the semiconductor light emitting device 150 is a blue semiconductor light emitting device that emits blue (B) light, and the phosphor layer 180 performs the role of converting the blue (B) light into the color of a sub-pixel. The phosphor layer 180 may be a red phosphor layer 181 or green phosphor layer 182 constituting individual pixels.

In other words, a red phosphor 181 capable of converting blue light into red (R) light may be deposited on the blue semiconductor light emitting device 151 at a position implementing a red sub-pixel, and a green phosphor 182 capable of converting blue light into green (G) light may be deposited on the blue semiconductor light emitting device 151 at a position implementing a green sub-pixel. Furthermore, only the blue semiconductor light emitting device 151 may be solely used at a location implementing a blue sub-pixel. In this case, the red (R), green (G) and blue (B) sub-pixels may implement one pixel. More specifically, one color phosphor may be deposited along each line of the first electrode 120. Accordingly, one line on the first electrode 120 may be an electrode controlling one color. In other words, red (R), green (G) and blue (B) may be sequentially disposed along the second electrode 140, thereby implementing sub-pixels.

However, the present disclosure may not be necessarily limited to this, and the semiconductor light emitting device 150 may be combined with quantum dot (QD) instead of phosphor to implement sub-pixels such as red (R), green (G) and blue (B).

Furthermore, a black matrix 191 may be disposed between each phosphor layer to enhance contrast. In other words, the black matrix 191 can enhance the contrast of luminance.

However, the present disclosure may not be necessarily limited to this, and another structure for implementing blue, red and green may be also applicable thereto.

Figure 5A:
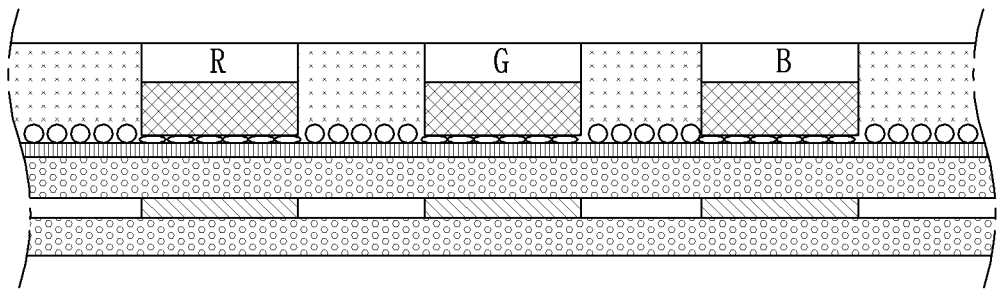
FIGS. 5A through 5C are conceptual views illustrating various forms for implementing colors in connection with a flip-chip type semiconductor light emitting device.

Referring to FIG. 5A, each of the semiconductor light emitting devices 150 may be implemented with a high-power light emitting device that emits various lights including blue in which gallium nitride (GaN) is mostly used, and indium (In) and or aluminum (Al) are added thereto.

In this case, the semiconductor light emitting device 150 may be red, green and blue semiconductor light emitting devices, respectively, to implement each sub-pixel. For instance, red, green and blue semiconductor light emitting devices (R, G, B) are alternately disposed, and red, green and blue sub-pixels implement one pixel by means of the red, green and blue semiconductor light emitting devices, thereby implementing a full color display.

Figure 5B:
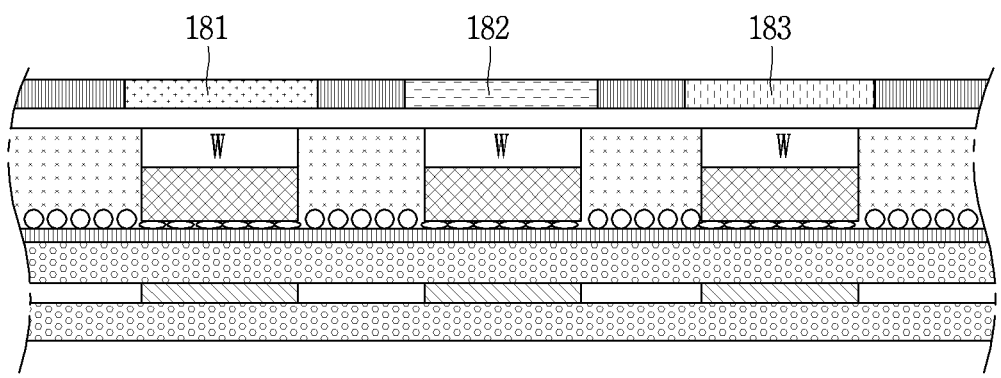

Referring to FIG. 5B, the semiconductor light emitting device may have a white light emitting device (W) provided with a yellow phosphor layer for each element. In this case, a red phosphor layer 181, a green phosphor layer 182 and blue phosphor layer 183 may be provided on the white light emitting device (W) to implement a sub-pixel. Furthermore, a color filter repeated with red, green and blue on the white light emitting device (W) may be used to implement a sub-pixel.

Figure 5C:
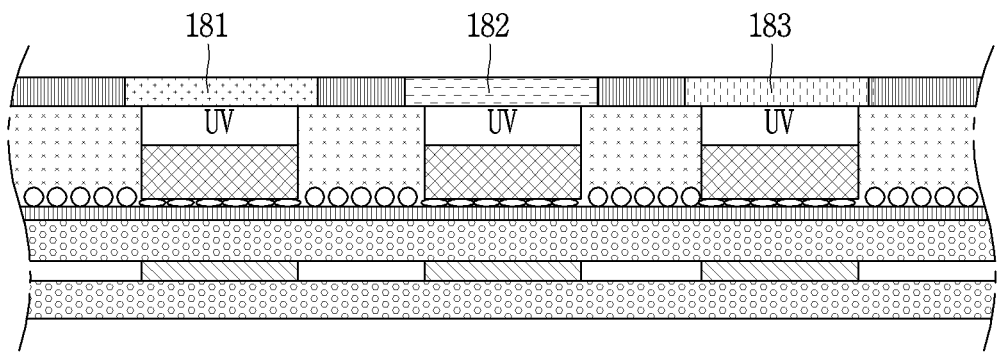

Referring to FIG. 5C, it may be possible to also have a structure in which a red phosphor layer 181, a green phosphor layer 182 and blue phosphor layer 183 may be provided on a ultra violet light emitting device (UV). In this manner, the semiconductor light emitting device can be used over the entire region up to ultra violet (UV) as well as visible light, and may be extended to a form of semiconductor light emitting device in which ultra violet (UV) can be used to as an excitation source.

Taking the present example into consideration again, the semiconductor light emitting device 150 is placed on the conductive adhesive layer 130 to constitute a sub-pixel in the display apparatus. The semiconductor light emitting device 150 may have excellent luminance characteristics, and thus it may be possible to configure individual sub-pixels even with a small size thereof. The size of the individual semiconductor light emitting device 150 may be less than 80 μm in the length of one side thereof, and formed with a rectangular or square shaped element. In case of a rectangular shaped element, the size thereof may be less than 20×80 μm.

Furthermore, even when a square shaped semiconductor light emitting device 150 with a length of side of 10 μm is used for a sub-pixel, it will exhibit a sufficient brightness for implementing a display apparatus. Accordingly, for example, in case of a rectangular pixel in which one side of a sub-pixel is 600 μm in size, and the remaining one side thereof is 300 μm, a relative distance between the semiconductor light emitting devices becomes sufficiently large. Accordingly, in this case, it may be possible to implement a flexible display apparatus having a HD image quality.

A display apparatus using the foregoing semiconductor light emitting device will be fabricated by a new type of fabrication method. Hereinafter, the fabrication method will be described with reference to FIG. 6.

Figure 6:
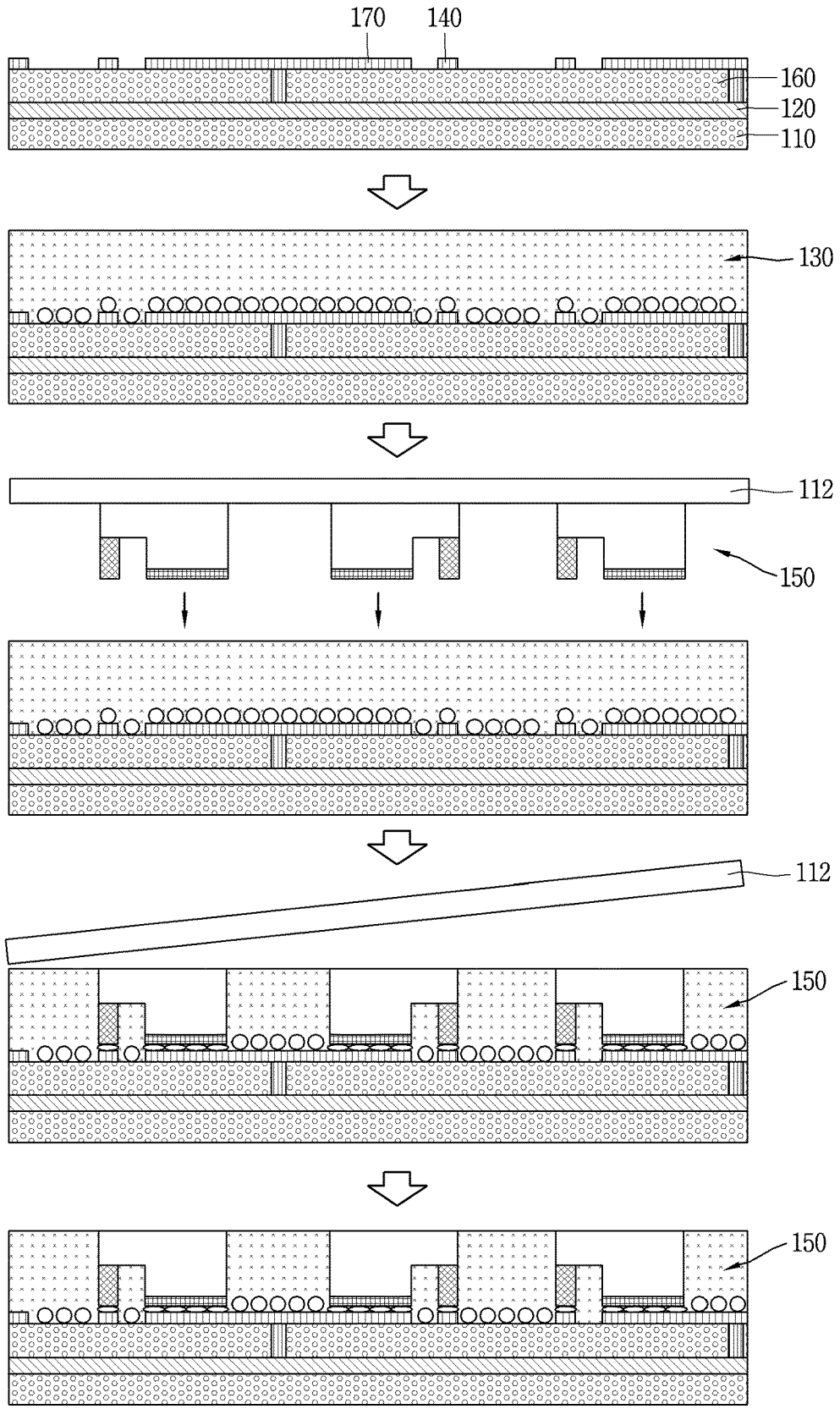
FIG. 6 is cross-sectional views showing a fabrication method of a display apparatus using a semiconductor light emitting device according to the present disclosure.

FIG. 6 is cross-sectional views showing a fabrication method of a display apparatus using a semiconductor light emitting device according to the present disclosure.

Referring to the drawing, first, the conductive adhesive layer 130 is formed on the insulating layer 160 located with the auxiliary electrode 170 and second electrode 140. The insulating layer 160 is deposited on the first substrate 110 to form one substrate (or wiring substrate), and the first electrode 120, auxiliary electrode 170 and second electrode 140 are disposed at the wiring substrate. In this case, the first electrode 120 and second electrode 140 may be disposed in a perpendicular direction to each other. Furthermore, the first substrate 110 and insulating layer 160 may contain glass or polyimide (PI), respectively, to implement a flexible display apparatus.

The conductive adhesive layer 130 may be implemented by an anisotropic conductive film, for example, and to this end, an anisotropic conductive film may be coated on a substrate located with the insulating layer 160.

Next, a second substrate 112 located with a plurality of semiconductor light emitting devices 150 corresponding to the location of the auxiliary electrodes 170 and second electrodes 140 and constituting individual pixels is disposed such that the semiconductor light emitting device 150 faces the auxiliary electrode 170 and second electrode 140.

In this case, the second substrate 112 as a growth substrate for growing the semiconductor light emitting device 150 may be a sapphire substrate or silicon substrate.

The semiconductor light emitting device may have a gap and size capable of implementing a display apparatus when formed in the unit of wafer, and thus effectively used for a display apparatus.

Next, the wiring substrate is thermally compressed to the second substrate 112. For example, the wiring substrate and second substrate 112 may be thermally compressed to each other by applying an ACF press head. The wiring substrate and second substrate 112 are bonded to each other using the thermal compression. Only a portion between the semiconductor light emitting device 150 and the auxiliary electrode 170 and second electrode 140 may have conductivity due to the characteristics of an anisotropic conductive film having conductivity by thermal compression, thereby allowing the electrodes and semiconductor light emitting device 150 to be electrically connected to each other. At this time, the semiconductor light emitting device 150 may be inserted into the anisotropic conductive film, thereby forming a partition wall between the semiconductor light emitting devices 150.

Next, the second substrate 112 is removed. For example, the second substrate 112 may be removed using a laser lift-off (LLO) or chemical lift-off (CLO) method.

Finally, the second substrate 112 is removed to expose the semiconductor light emitting devices 150 to the outside. Silicon oxide (SiOx) or the like may be coated on the wiring substrate coupled to the semiconductor light emitting device 150 to form a transparent insulating layer (not shown).

Furthermore, it may further include the process of forming a phosphor layer on one surface of the semiconductor light emitting device 150. For example, the semiconductor light emitting device 150 may be a blue semiconductor light emitting device for emitting blue (B) light, and red or green phosphor for converting the blue (B) light into the color of the sub-pixel may form a layer on one surface of the blue semiconductor light emitting device.

The fabrication method or structure of a display apparatus using the foregoing semiconductor light emitting device may be modified in various forms. For such an example, the foregoing display apparatus may be applicable to a vertical semiconductor light emitting device. Hereinafter, the vertical structure will be described with reference to FIGS. 5 and 6.

Furthermore, according to the following modified example or embodiment, the same or similar reference numerals are designated to the same or similar configurations to the foregoing example, and the description thereof will be substituted by the earlier description.

Figure 7:
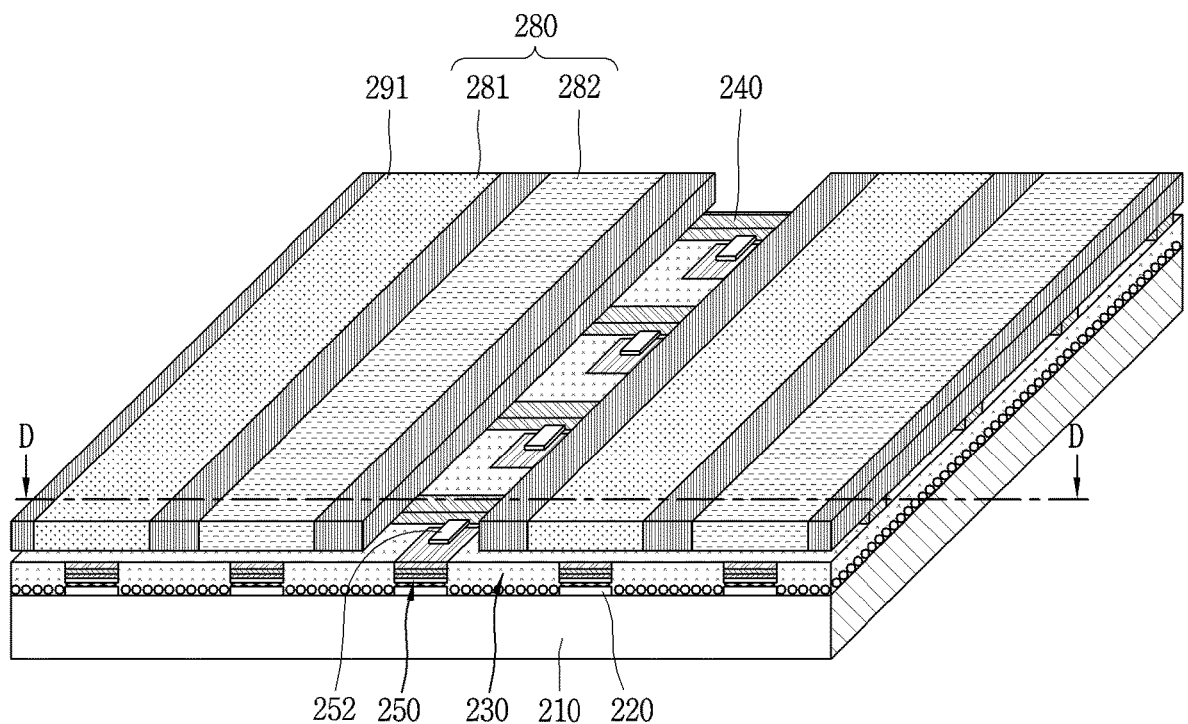
FIG. 7 is a perspective view showing a display apparatus using a semiconductor light emitting device according to another embodiment of the present disclosure.
Figure 8:
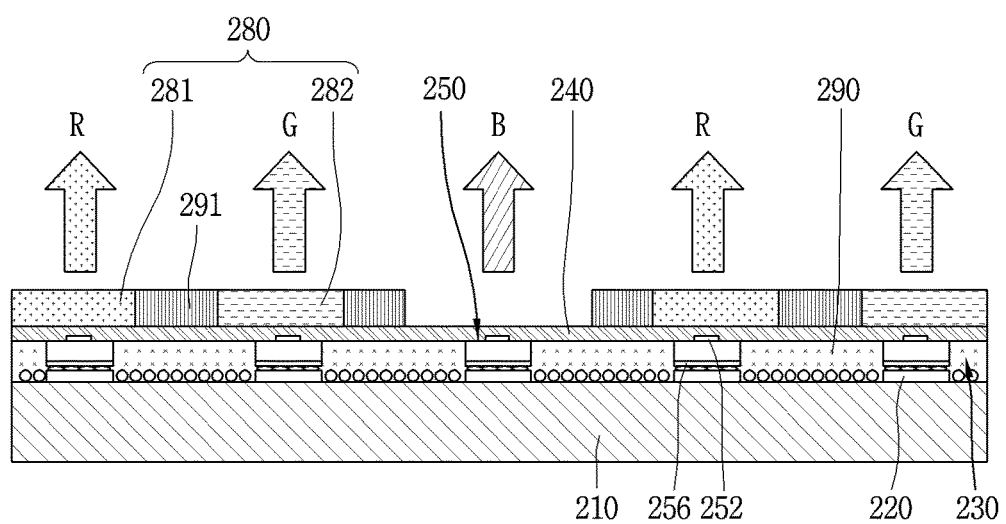
FIG. 8 is a cross-sectional view taken along line D-D in FIG. 7.
Figure 9:
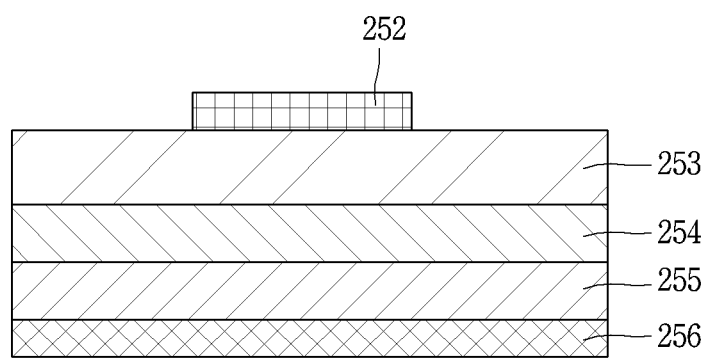
FIG. 9 is a conceptual view showing a vertical semiconductor light emitting device in FIG. 8.

FIG. 7 is a perspective view illustrating a display apparatus using a semiconductor light emitting device according to another embodiment of the present disclosure. FIG. 8 is a cross-sectional view taken along line C-C in FIG. 7, and FIG. 9 is a conceptual view illustrating a vertical type semiconductor light emitting device in FIG. 8.

According to the drawings, the display apparatus may be display apparatus using a passive matrix (PM) type of vertical semiconductor light emitting device.

The display apparatus may include a substrate 210, a first electrode 220, a conductive adhesive layer 230, a second electrode 240 and a plurality of semiconductor light emitting devices 250.

The substrate 210 as a wiring substrate disposed with the first electrode 220 may include polyimide (PI) to implement a flexible display apparatus. In addition, any one may be used if it is an insulating and flexible material.

The first electrode 220 may be located on the substrate 210, and formed with a bar-shaped electrode elongated in one direction. The first electrode 220 may be formed to perform the role of a data electrode.

The conductive adhesive layer 230 is formed on the substrate 210 located with the first electrode 220. Similar to a display apparatus to which a flip chip type light emitting device is applied, the conductive adhesive layer 230 may be an anisotropic conductive film (ACF), an anisotropic conductive paste, a solution containing conductive particles, and the like. However, the present embodiment illustrates a case where the conductive adhesive layer 230 is implemented by an anisotropic conductive film.

When an anisotropic conductive film is located in a state that the first electrode 220 is located on the substrate 210, and then heat and pressure are applied to connect the semiconductor light emitting device 250 thereto, the semiconductor light emitting device 250 is electrically connected to the first electrode 220. At this time, the semiconductor light emitting device 250 may be preferably disposed on the first electrode 220.

The electrical connection is generated because an anisotropic conductive film partially has conductivity in the thickness direction when heat and pressure are applied as described above. Accordingly, the anisotropic conductive film is partitioned into a portion 231 having conductivity and a portion 232 having no conductivity in the thickness direction thereof.

Furthermore, the anisotropic conductive film contains an adhesive component, and thus the conductive adhesive layer 230 implements a mechanical coupling as well as an electrical coupling between the semiconductor light emitting device 250 and the first electrode 220.

In this manner, the semiconductor light emitting device 250 is placed on the conductive adhesive layer 230, thereby configuring a separate sub-pixel in the display apparatus. The semiconductor light emitting device 250 may have excellent luminance characteristics, and thus it may be possible to configure individual sub-pixels even with a small size thereof. The size of the individual semiconductor light emitting device 250 may be less than 80 µm in the length of one side thereof, and formed with a rectangular or square shaped element. In case of a rectangular shaped element, the size thereof may be less than 20×80 µm.

The semiconductor light emitting device 250 may be a vertical structure.

A plurality of second electrodes 240 disposed in a direction of crossing the length direction of the first electrode 220, and electrically connected to the vertical semiconductor light emitting device 250 may be located between vertical semiconductor light emitting devices.

Referring to FIG. 9, the vertical semiconductor light emitting device may include a p-type electrode 256, a p-type semiconductor layer 255 formed with the p-type electrode 256, an active layer 254 formed on the p-type semiconductor layer 255, an n-type semiconductor layer 253 formed on the active layer 254, and an n-type electrode 252 formed on the n-type semiconductor layer 253. In this case, the p-type electrode 256 located at the bottom thereof may be electrically connected to the first electrode 220 by the conductive adhesive layer 230, and the n-type electrode 252 located at the top thereof may be electrically connected to the second electrode 240 which will be described later. The electrodes may be disposed in the upward/downward direction in the vertical semiconductor light emitting device 250, thereby providing a great advantage capable of reducing the chip size.

Referring again to FIG. 8, a phosphor layer 280 may be formed on one surface of the semiconductor light emitting device 250. For example, the semiconductor light emitting device 250 is a blue semiconductor light emitting device 251 that emits blue (B) light, and the phosphor layer 280 for converting the blue (B) light into the color of the sub-pixel may be provided thereon. In this case, the phosphor layer 280 may be a red phosphor 281 and a green phosphor 282 constituting individual pixels.

In other words, a red phosphor 281 capable of converting blue light into red (R) light may be deposited on the blue semiconductor light emitting device 251 at a position implementing a red sub-pixel, and a green phosphor 282 capable of converting blue light into green (G) light may be deposited on the blue semiconductor light emitting device 251 at a position implementing a green sub-pixel. Furthermore, only the blue semiconductor light emitting device 251 may be solely used at a location implementing a blue sub-pixel. In this case, the red (R), green (G) and blue (B) sub-pixels may implement one pixel.

However, the present disclosure may not be necessarily limited to this, and another structure for implementing blue, red and green may be also applicable thereto as described above in a display apparatus to which a flip chip type light emitting device is applied.

Taking the present embodiment into consideration again, the second electrode 240 is located between the semiconductor light emitting devices 250, and electrically connected to the semiconductor light emitting devices 250. For example, the semiconductor light emitting devices 250 may be disposed in a plurality of rows, and the second electrode 240 may be located between the rows of the semiconductor light emitting devices 250.

Since a distance between the semiconductor light emitting devices 250 constituting individual pixels is sufficiently large, the second electrode 240 may be located between the semiconductor light emitting devices 250.

The second electrode 240 may be formed with a bar-shaped electrode elongated in one direction, and disposed in a perpendicular direction to the first electrode.

Furthermore, the second electrode 240 may be electrically connected to the semiconductor light emitting device 250 by a connecting electrode protruded from the second electrode 240. More specifically, the connecting electrode may be an n-type electrode of the semiconductor light emitting device 250. For example, the n-type electrode is formed with an ohmic electrode for ohmic contact, and the second electrode covers at least part of the ohmic electrode by printing or deposition. Through this, the second electrode 240 may be electrically connected to the n-type electrode of the semiconductor light emitting device 250.

According to the drawing, the second electrode 240 may be located on the conductive adhesive layer 230. According to circumstances, a transparent insulating layer (not shown) containing silicon oxide (SiOx) may be formed on the substrate 210 formed with the semiconductor light emitting device 250. When the transparent insulating layer is formed and then the second electrode 240 is placed thereon, the second electrode 240 may be located on the transparent insulating layer. Furthermore, the second electrode 240 may be formed to be separated from the conductive adhesive layer 230 or transparent insulating layer.

If a transparent electrode such as indium tin oxide (ITO) is used to locate the second electrode 240 on the semiconductor light emitting device 250, the ITO material has a problem of bad adhesiveness with an n-type semiconductor. Accordingly, the second electrode 240 may be placed between the semiconductor light emitting devices 250, thereby obtaining an advantage in which the transparent electrode is not required. Accordingly, an n-type semiconductor layer and a conductive material having a good adhesiveness may be used as a horizontal electrode without being restricted by the selection of a transparent material, thereby enhancing the light extraction efficiency.

According to the drawing, a partition wall 290 may be formed between the semiconductor light emitting devices 250. In other words, the partition wall 290 may be disposed between the vertical semiconductor light emitting devices 250 to isolate the semiconductor light emitting device 250 constituting individual pixels. In this case, the partition wall 290 may perform the role of dividing individual sub-pixels from one another, and be formed as an integral body with the conductive adhesive layer 230. For example, a base member of the anisotropic conductive film may form the partition wall when the semiconductor light emitting device 250 is inserted into the anisotropic conductive film.

Furthermore, when the base member of the anisotropic conductive film is black, the partition wall 290 may have reflective characteristics while at the same time increasing contrast with no additional black insulator.

For another example, a reflective partition wall may be separately provided with the partition wall 290. The partition wall 290 may include a black or white insulator according to the purpose of the display apparatus.

If the second electrode 240 is precisely located on the conductive adhesive layer 230 between the semiconductor light emitting devices 250, the partition wall 290 may be located between the vertical semiconductor light emitting device 250 and second electrode 240. Accordingly, individual sub-pixels may be configured even with a small size using the semiconductor light emitting device 250, and a distance between the semiconductor light emitting devices 250 may be relatively sufficiently large to place the second electrode 240 between the semiconductor light emitting devices 250, thereby having the effect of implementing a flexible display apparatus having a HD image quality.

Furthermore, according to the drawing, a black matrix 291 may be disposed between each phosphor layer to enhance contrast. In other words, the black matrix 291 can enhance the contrast of luminance.

As described above, the semiconductor light emitting device 250 is located on the conductive adhesive layer 230, thereby constituting individual pixels on the display apparatus. The semiconductor light emitting device 250 may have excellent luminance characteristics, and thus it may be possible to configure individual sub-pixels even with a small size thereof. As a result, it may be possible to implement a full color display in which the sub-pixels of red (R), green (G) and blue (B) implement one pixel by means of the semiconductor light emitting device.

On the other hand, in a display apparatus provided with a semiconductor light emitting device, there is a problem in that the price is very high due to the foregoing conductive adhesive layer, and stable attachment is difficult in a large area. Accordingly, the present disclosure proposes a new wiring structure capable of suppressing cost increase using a structure as well as coping with a large area.

In a new structure of the present disclosure, semiconductor light emitting device will be arranged between ribs and wired using a solderable metal, which will be described in detail below.

Hereinafter, a display apparatus to which a new structure is applied will be described in more detail with reference to the accompanying drawings.

Figure 10:
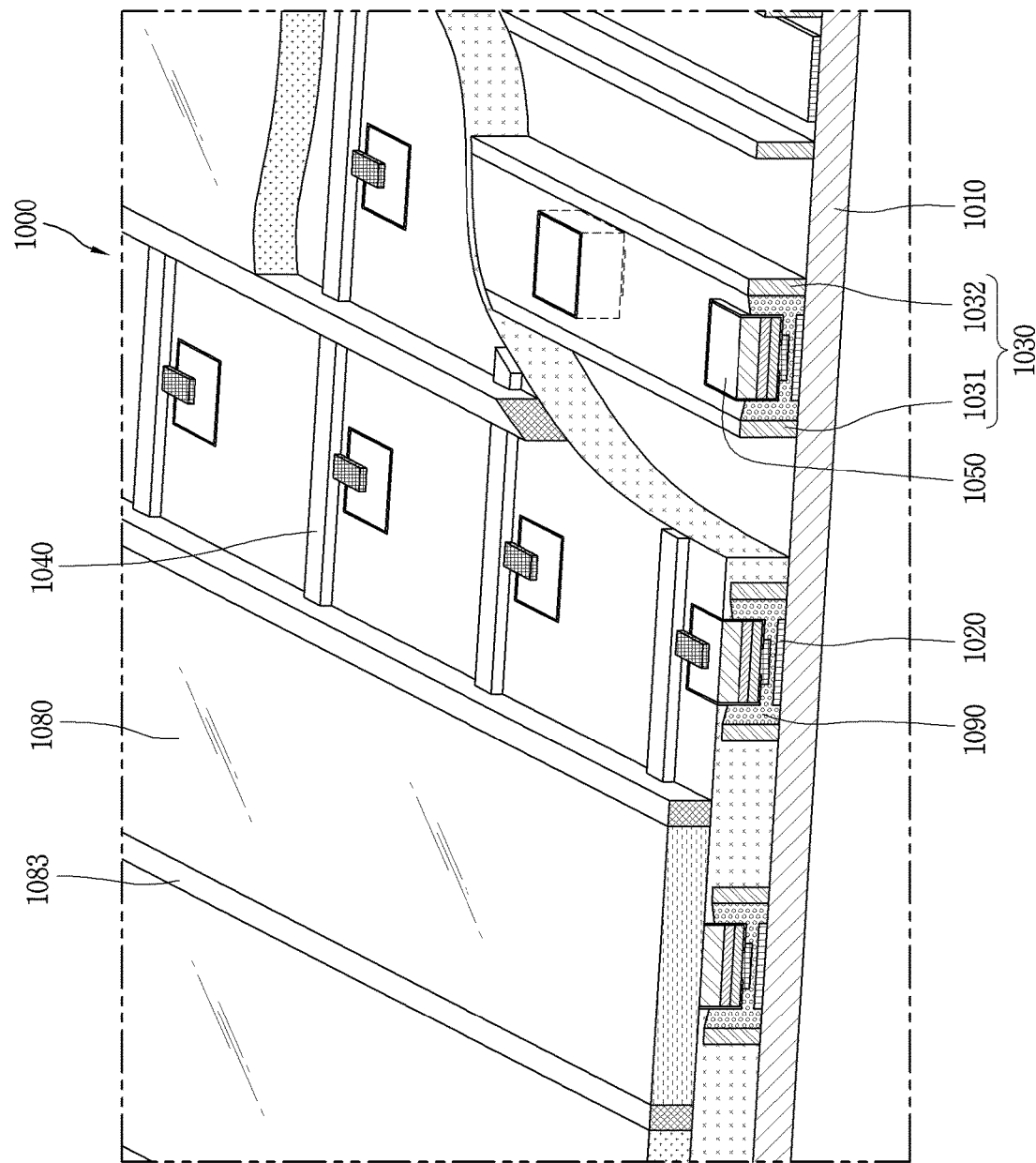
FIGS. 10 and 11 are enlarged and plan views showing a portion A in FIG. 1 for explaining another embodiment of the present disclosure to which a semiconductor light emitting device having a new structure according to the present disclosure is applied.
Figure 11:
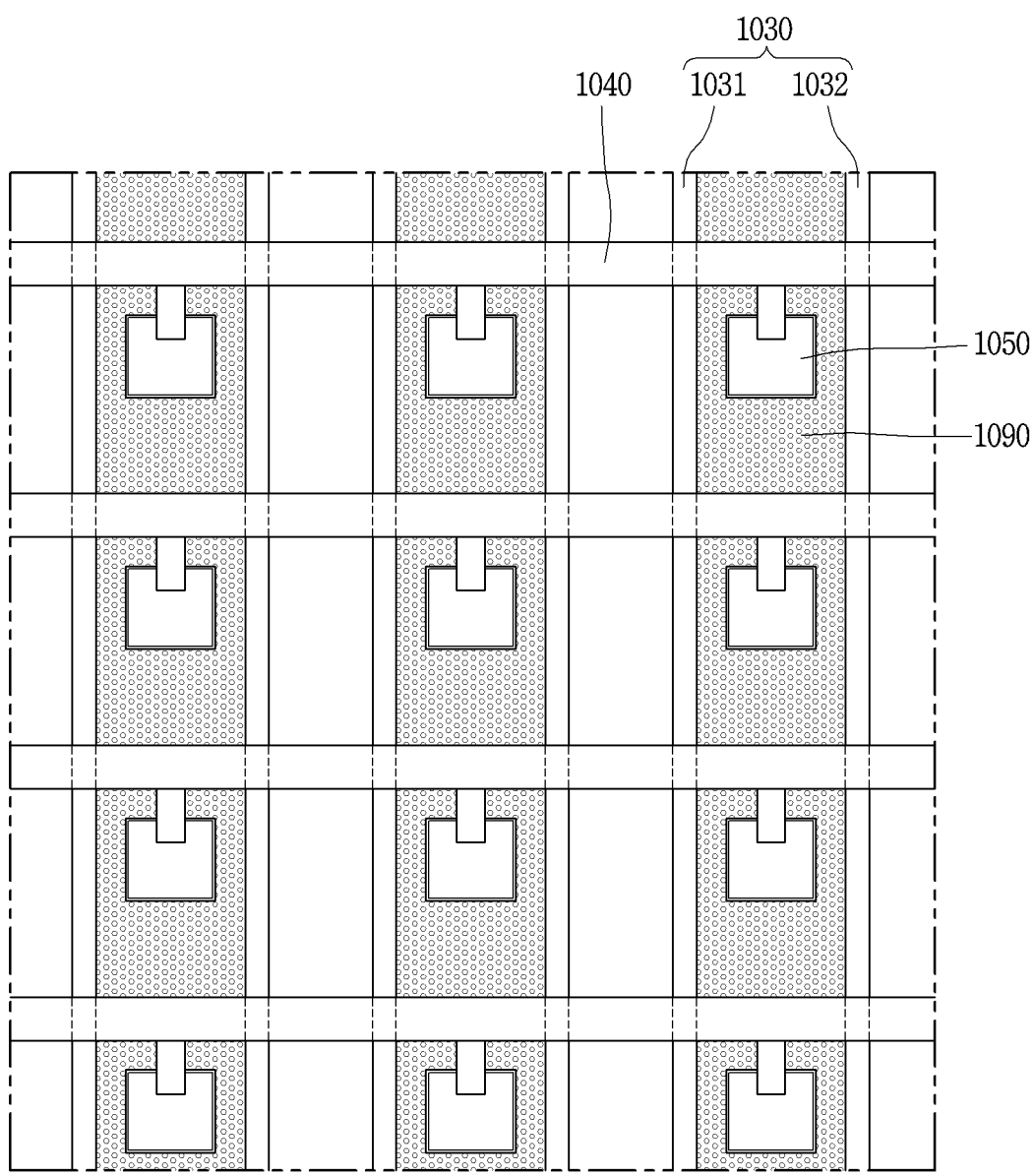
Figure 12:
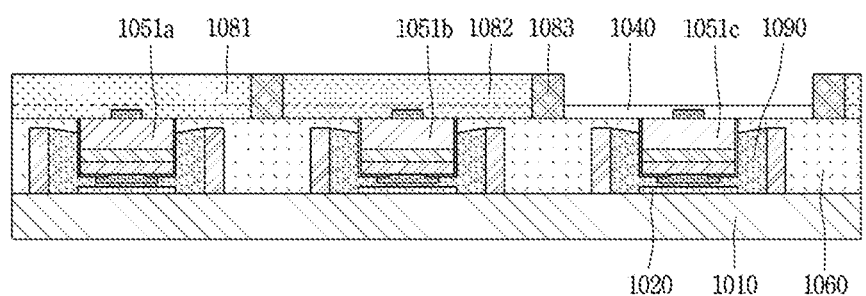
FIGS. 12 and 13 are cross-sectional views taken along line E-E and line F-F in FIG. 10.
Figure 13:
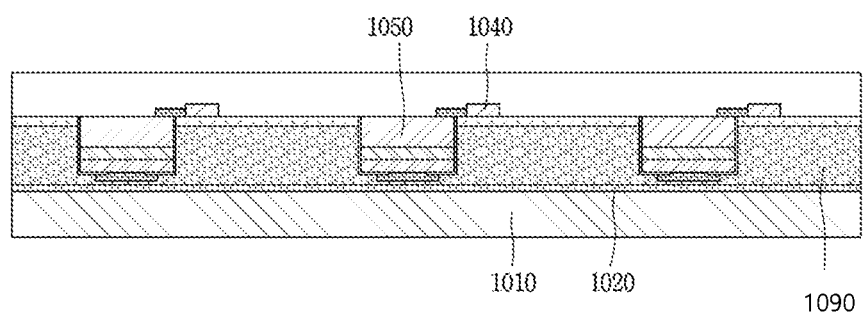
Figure 14:
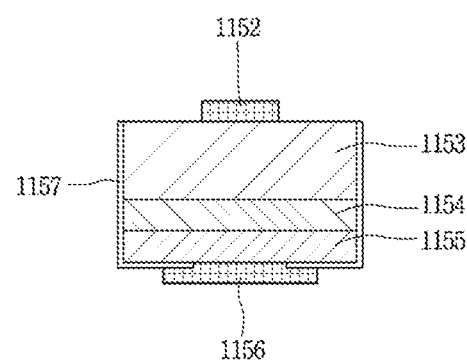
FIG. 14 is an enlarged view showing a vertical semiconductor light emitting device in FIG. 10.

FIGS. 10 and 11 are enlarged and plan views showing a portion A in FIG. 1 for explaining another embodiment of the present disclosure to which a semiconductor light emitting device having a new structure according to the present disclosure is applied, and FIGS. 12 and 13 are cross-sectional views taken along line E-E and line F-F in FIG. 10, and FIG. 14 is an enlarged view showing a vertical semiconductor light emitting device in FIG. 10.

According to the illustrations of FIGS. 10, 11, 12, 13 and 14, a display apparatus 1000 using a semiconductor light emitting device is illustrated as a display apparatus 1000 using a passive matrix (PM) type semiconductor light emitting device. However, an example described below may also be applicable to an active matrix (AM) type semiconductor light emitting device.

The display apparatus 1000 may include a substrate 1010, a first wiring 1020, a rib portion 1030, a solderable metal 1090, and a plurality of semiconductor light emitting devices 1050. Here, the first wiring 1020 and the second wiring 1040 may respectively include a plurality of electrode lines.

The substrate 1010 as a wiring substrate disposed with the first electrode 1020 may include polyimide (PI) to implement a flexible display apparatus. In addition, it may be implemented as a non-flexible display or a signage, and thus any insulating and flexible material may be used for the substrate 1010

The first wiring 1020 may be located on the substrate 1010, and formed with a bar-shaped electrode elongated in one direction. The first wiring 1020 may be formed to perform the role of a data electrode. Furthermore, the second wiring 1020 may be a lower wiring since it is disposed at a lower portion of the semiconductor light emitting device.

The rib portions 1030 are disposed at both sides of the lower wiring, and configured to protrude from one surface of the substrate 1010. The rib portion 1030 may be formed of a plurality of lines, and each line may include a pair of ribs. For example, a first rib 1031 and a second rib 1032 spaced apart from each other may constitute one line. In this case, the rib portion 1030 may be disposed such that a separation distance between the plurality of lines is greater than that between the first rib 1031 and the second rib 1032.

The first rib 1031 and the second rib 1032 may have the same height with respect to the substrate, and may be formed of the same material. In addition, the height of the rib portion 1030 is configured to be higher than the lower wiring with respect to one surface of the substrate 1010.

For another example, the rib portion 1030 may include a black or white insulator according to the purpose of the display apparatus. When the rib portion 1030 with a white insulator is used, an effect of enhancing reflectivity may be obtained, and when the rib portion 1030 with a black insulator is used, a contrast ratio may be increased while having a reflection characteristic.

According to the drawing, an adhesive layer may be disposed between the substrate 1010 on which the first wiring 1020 is located and the semiconductor light emitting device 1050. The adhesive layer has a low melting point and may include a solderable metal. More specifically, the solderable metal 1090 is filled between the first rib and the second rib, and is disposed to cover the lower wiring.

As described above, the solderable metal 1090 may be disposed to physically connect the first wiring 1020 and the semiconductor light emitting device 1050. Accordingly, the semiconductor light emitting device 1050 and the first wiring 1020 may be connected to each other for electrical conduction.

For example, the solderable metal 1090 may be formed of a material having a low melting point, and applied in the form of a dot or a line to the rib portion 1030.

When applied in the form of a dot, it may be disposed at a position corresponding to the semiconductor light emitting device at the same interval as the semiconductor light emitting device along a line of the rib portion 1030. When applied in the form of a line, it may be applied to fill all the line between the first rib 1031 and the second rib 1032 of the rib portion 1030.

More specifically, the semiconductor light emitting device 1050 is electrically and physically connected to the substrate through soldering using the solderable metal 1090. Soldering refers to bonding metals together using solder, flux and heat. The solderable metal 1090 may be, for example, at least one of Sn, Ag, Cu, Pb, Al, Bi, Cd, Fe, In, Ni, Sb, Zn, Co, and Au.

Furthermore, for another example, the adhesive layer may be formed of silver paste, tin paste, and solder paste. The enumeration for the adhesive layer is exemplary only, and the present disclosure is not limited thereto.

According to the illustration, the plurality of semiconductor light emitting devices 1050 are sequentially disposed along the rib portion 1030, and at least part thereof are inserted into the solderable metal 1090 to be electrically connected to the lower wiring. For example, the semiconductor light emitting devices 1050 are arranged at a predetermined interval between the first rib 1031 and the second rib 1032, and in this case, the first rib 1031 and the second rib 1032 are configured to be symmetrical left and right with respect to the semiconductor light emitting device.

Here, the semiconductor light emitting devices 1050 may configure a plurality of columns in a direction parallel to a plurality of electrode lines provided in the first wiring 1020. Furthermore, the semiconductor light emitting devices 1050 may constitute a plurality of rows in a direction intersecting the first wiring 1020.

According to the illustration, the semiconductor light emitting devices 1050 may be either one of a green semiconductor light emitting device and a blue semiconductor light emitting device.

In this case, the structures of the green semiconductor light emitting device and the blue semiconductor light emitting device are the same, which will be described first with reference to FIG. 14.

The semiconductor light emitting device may be mostly formed of gallium nitride (GaN), and indium (In) and/or aluminum (Al) may be added thereto to implement a high-power light emitting device that emits blue or green light. For such an example, the plurality of semiconductor light emitting devices 1050 may be gallium nitride thin layers formed with various layers, such as n-Gan, p-Gan, AlGaN, InGan, and the like.

In addition, the semiconductor light emitting device may be a micro light emitting diode chip. Here, the micro light emitting diode chip may have a cross-sectional area smaller than that of the light emitting region in the sub-pixel, and may have a scale of 1 to 100 micrometers, for such an example.

Referring to FIG. 14, the semiconductor light emitting device 1050, as a vertical semiconductor light emitting device, includes a first conductive electrode 1156, a first conductive semiconductor layer 1155 disposed with the first conductive electrode 1156, an active layer 1154 disposed on the first conductive semiconductor layer 1155, a second conductive semiconductor layer 1153 disposed on the active layer 1154, and a second conductive electrode 1152 disposed on the second conductive semiconductor layer 1153.

The first conductive semiconductor layer 1155 and the second conductive semiconductor layer 1153 overlap with each other, and the second conductive electrode 1152 is disposed on an upper surface of the second conductive semiconductor layer 1153, and the first conductive electrode 1156 is disposed on a lower surface of the first conductive semiconductor layer 1155. In this case, the upper surface of the second conductive semiconductor layer 1153 may be one surface of the second conductive semiconductor layer 1153 farthest from the first conductive semiconductor layer 1155, and the lower surface of the first conductive semiconductor layer 1155 may be one surface of the first conductive semiconductor layer 1155 farthest from the second conductive semiconductor layer 1153. As described above, the first conductive electrode 1156 and the second conductive electrode 1152 are disposed above and below the first conductive semiconductor layer 1155 and the second conductive semiconductor layer 1153, respectively, by interposing them therebetween.

In addition, a passivation layer 1157 may be provided at the outermost side of the semiconductor light emitting device 1050, thereby improving stabilization characteristics of the semiconductor light emitting device 1050. The passivation layer 1157 may cover the first conductive semiconductor layer 1155, the active layer 1154, and the second conductive semiconductor layer 1153 in the semiconductor light emitting device 1050a.

Referring to FIG. 14 along with FIGS. 10 through 13, a lower surface of the first conductive semiconductor layer 1155 may be a surface closest to the wiring substrate, and an upper surface of the second conductive semiconductor layer may be a surface farthest from the wiring substrate.

More specifically, the first conductive electrode 1156 and the first conductive semiconductor layer 1155 may be a p-type electrode and a p-type semiconductor layer, respectively, and the second conductive electrode 1152 and the second conductive semiconductor layer 1153 may be an n-type electrode and an n-type semiconductor layer, respectively. However, the present disclosure is not limited thereto, and the first conductive type may be n-type and the second conductive type may be p-type. However, the p-type semiconductor layer may be p-type GaN and the n-type semiconductor layer may be n-type GaN. In addition, according to another embodiment of the present disclosure, impurities may be implanted into an intrinsic or a doped semiconductor substrate to form the first and the second conductive semiconductor layer. Moreover, the region where a p-n junction is formed by the impurity implantation may serve as the active layer.

In this case, the p-type electrode 1156 located at the bottom thereof may be electrically connected to the first wiring 1020 by a solderable metal, and the n-type electrode 1152 located at the top thereof may be electrically connected to the second electrode 1040. Here, the p-type electrode may include a plurality of metal layers formed of different metals. For example, a plurality of metal layers made of Ti, Pt, Au, Ti, Cr or the like may be deposited to form the p-type electrode.

The first wiring 1020 and the second wiring 1040 may be disposed with the semiconductor light emitting devices interposed therebetween. A plurality of second wirings 1040 may be arranged in a direction intersecting a length direction of the first wiring 1020. A plurality of semiconductor light emitting devices 1050 are coupled to the wiring substrate 1010, and electrically connected to the first electrode 1020 and the second electrode 1040 by the foregoing structure.

According to the illustration, the second wiring 1040 may be located on a planarizing layer 1060. More specifically, the rib portion is filled with an insulating material to cover the solderable metal to form a flat layer 1060, and the second electrode 1040, which is an upper wiring, is disposed on one surface of the planarizing layer 1060. In other words, the planarizing layer is formed to cover the solderable metal, and an upper wiring electrically connected to the semiconductor light emitting devices is disposed on the planarizing layer.

More specifically, the planarizing layer 1060 may be incorporated into the substrate 1010 with an insulating and flexible material such as polyimide (PI), PET, PEN, PDMS, PMPS, or the like to constitute a single wiring substrate.

For a more specific example, the planarizing layer 1060 may be a PDMS & PMPS mixture (0≤PDMS≤100) containing a transparent resin or white material. By the insulating layer, the chip may be protected from an external environment, and furthermore, light extraction efficiency may be improved. In this case, the second electrode 1040 may be electrically connected by contact with the second conductive electrode 1040 of the semiconductor light emitting device 1050. The planarizing layer may be formed to fill between the semiconductor light emitting devices. For such an example, the insulating material of the planarizing layer may be filled between the plurality of rib portions.

According to the illustration, a phosphor layer 1080 is formed on an upper surface of the rib portion, and the phosphor layer 1080 may be extended to cover the insulating material.

The phosphor layer 1080 may be formed to cover a plurality of semiconductor light emitting devices 1050, and disposed on the planarizing layer as a structure for converting the wavelength of light to implementing three primary colors of red, green, and blue. In other words, the phosphor layer 1080 is formed to cover the planarizing layer and the semiconductor light emitting devices to convert the wavelength of light.

For example, the semiconductor light emitting device 1050 is a blue semiconductor light emitting device that emits blue (B) light, and the phosphor layer 1080 performs the role of converting the blue (B) light into the color of a sub-pixel. The phosphor layer 1080 may be a red phosphor layer 1081 or green phosphor layer 1082 constituting individual pixels. In other words, a red phosphor 1081 capable of converting blue light into red (R) light may be deposited on the blue semiconductor light emitting device 1051a at a position implementing a red sub-pixel, and a green phosphor 1082 capable of converting blue light into green (G) light may be deposited on the blue semiconductor light emitting device 1051b at a position implementing a green sub-pixel. Furthermore, only the blue semiconductor light emitting device 1051c may be solely used at a portion constituting a blue sub-pixel. In this case, the red (R), green (G) and blue (B) sub-pixels may implement one pixel. More specifically, one color phosphor may be deposited along each line of the first electrode 1020. Accordingly, one line on the first electrode 1020 may be an electrode controlling one color. In other words, red (R), green (G) and blue (B) may be sequentially disposed along the second electrode 1040, thereby implementing sub-pixels. However, the present disclosure may not be necessarily limited to this, and the semiconductor light emitting device 1050 may be combined with a quantum dot (QD) instead of a phosphor to implement sub-pixels that emit red (R), green (G) and blue (B).

On the other hand, in order to improve the contrast of the phosphor layer 1080, the display apparatus may further include a black matrix 1083 disposed between each phosphor. The black matrix 1083 may be formed in such a manner that a gap is formed between the phosphor dots and a black material fills the gap. Through this, the black matrix 1083 may improve contrast between light and dark while absorbing external light reflection. The black matrix 1083 is located between respective phosphor layers along the second electrode 1040 in a direction in which the phosphor layers 1080 are deposited. In this case, a phosphor layer may not be formed at a position corresponding to the blue semiconductor light emitting device, but the black matrix 1083 may be respectively formed at both sides thereof with a space that does not have the phosphor layer therebetween (or with the blue light emitting device therebetween).

Meanwhile, referring to the semiconductor light emitting device 1050 according to the present example, the electrodes may be disposed in an upward/downward direction in the semiconductor light emitting device 1050 in the present embodiment, thereby having a great advantage capable of reducing the chip size. However, the electrode may be disposed on the top and the bottom, but the semiconductor light emitting device may be a flip chip type semiconductor light emitting device.

Figure 15:
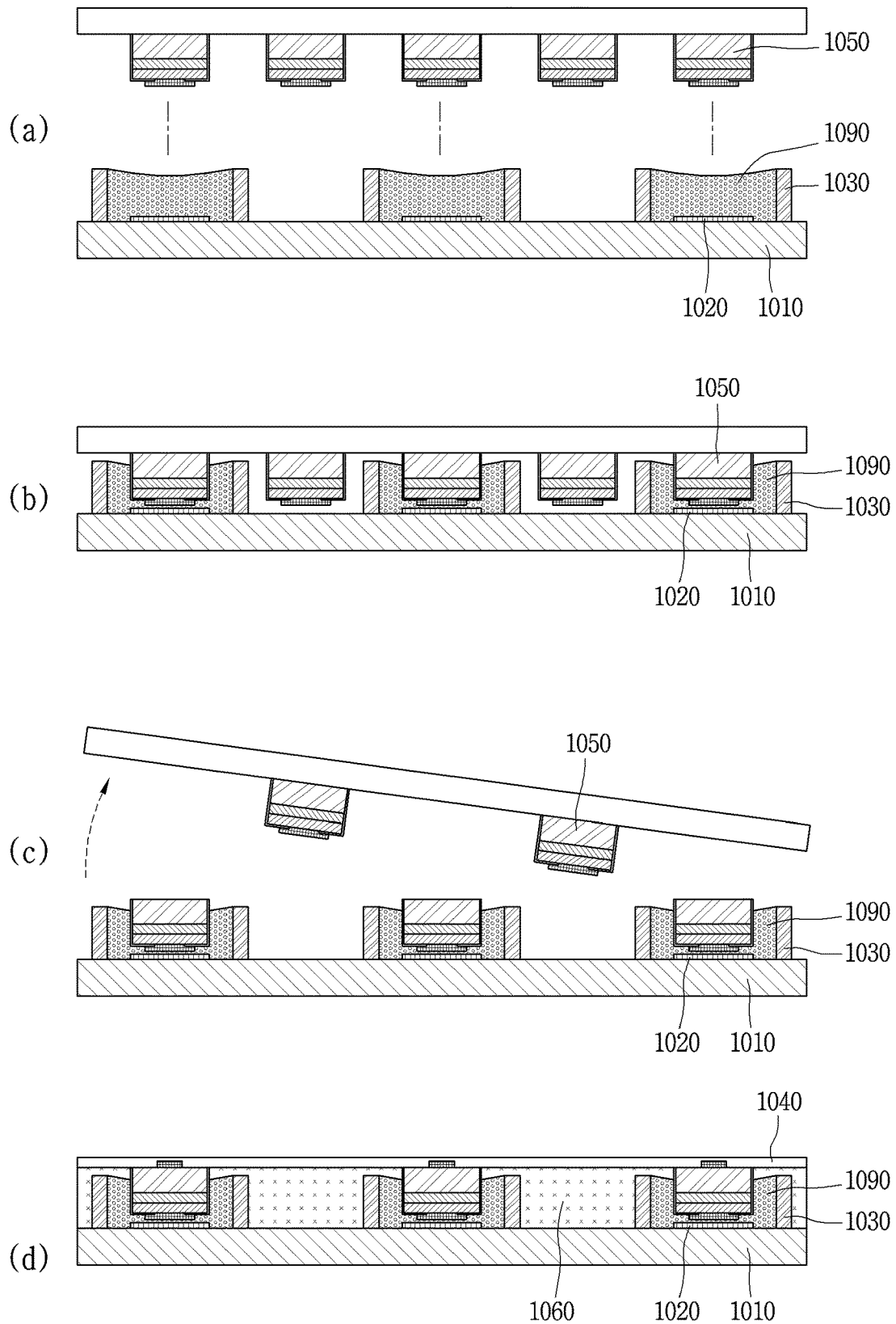
FIG. 15 is a process diagram showing a process of performing selectively transfer in a fabrication method of a display in FIG. 10.

In addition, selective transfer is enabled by a structure using the rib portion as described above. FIG. 15 is a process diagram showing a process of performing selectively transfer in a fabrication method of a display in FIG. 10.

Referring to this drawing, first, the solderable metal is filled in the rib portion 1030 to cover the first electrode on the wiring substrate on which the first electrode 1020 is located. Then, heat is applied to convert the solderable metal into a liquid phase ((a) in FIG. 15).

Next, a substrate on which the plurality of semiconductor light emitting devices 1050 constituting individual pixels are located is disposed such that the semiconductor light emitting devices 1050 face the rib portion 1030 and the second electrode 1020. In this case, the substrate as a growth substrate for growing a semiconductor light emitting device 1050 may be a sapphire substrate or silicon substrate.

Then, the wiring substrate and the growth substrate are pressed. A lower portion of the semiconductor light emitting device is inserted into the liquid-phase solderable metal, and the semiconductor light emitting device is coupled to the wiring substrate by curing the solderable metal ((b) in FIG. 15). At this time, among the semiconductor light emitting devices on the growth substrate, light emitting devices that do not face the rib portion are disposed between the rib portions, but contact between the structure to the semiconductor light emitting devices does not occur since a gap between the rib portions is an empty space.

Next, the growth substrate is removed ((c) in FIG. 15). For example, the growth substrate may be removed using a laser lift-off (LLO) or chemical lift-off (CLO) method. In this case, the semiconductor light emitting device between the ribs is covered using a reflector to apply laser only to the semiconductor light emitting device inserted in the solderable metal. Through this, the semiconductor light emitting devices on the growth substrate are selectively transferred to the wiring substrate.

Finally, an insulating material is filled to constitute a planarizing layer, and deposit the upper wiring ((d) in FIG. 15).

On the other hand, as in the present disclosure, a display apparatus for connecting a semiconductor light emitting device to a wiring substrate using a rib portion may be modified in various forms. Hereinafter, another embodiment of the present disclosure will be described.

Figure 16:
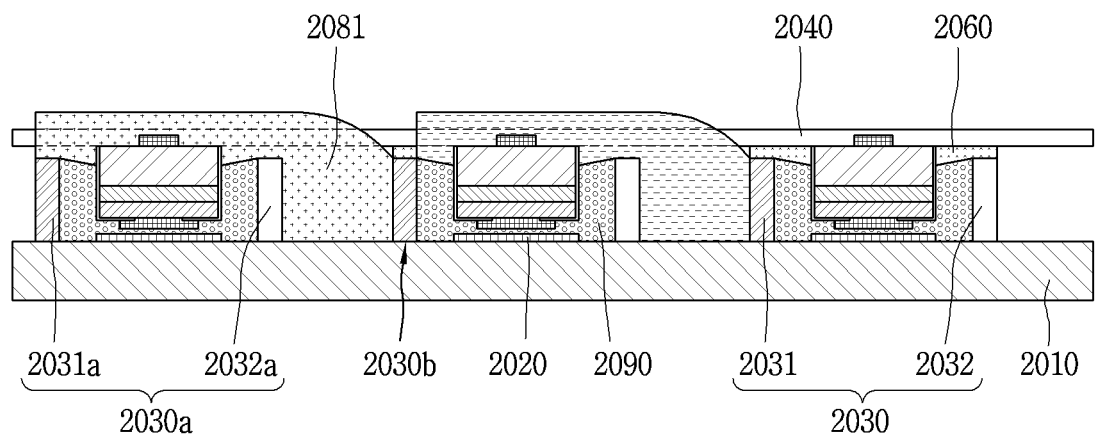
FIGS. 16 and 17 are conceptual views showing another embodiment of a display apparatus according to the present disclosure.
Figure 17:
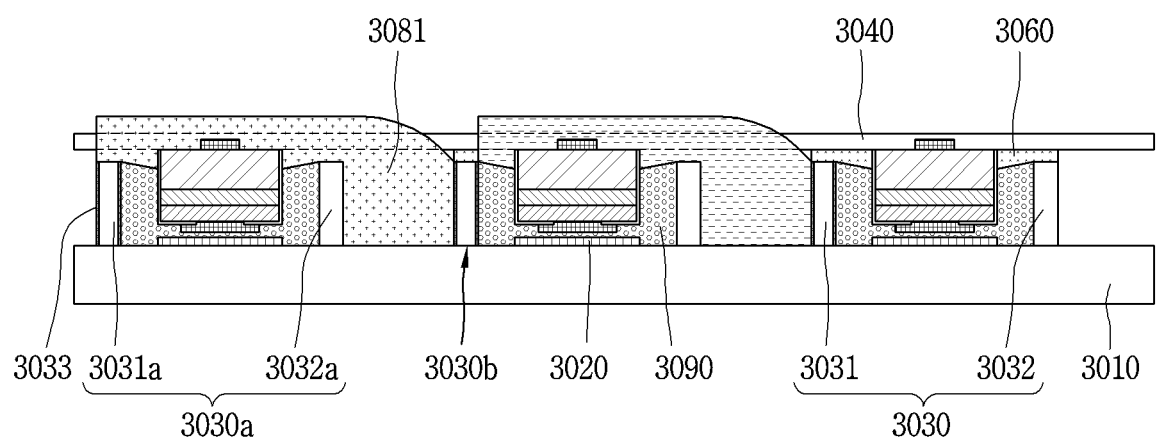

FIGS. 16 and 17 are conceptual views showing another embodiment of a display apparatus according to the present disclosure.

According to the illustration of FIG. 16, a structure in which a phosphor layer extends between rib portions is disclosed.

In this case, the display apparatus may include a substrate 2010, a first wiring 2020, a rib portion 2020, a second wiring 2040, a planarizing layer 2060, a phosphor layer 2080, a solderable metal 2090 and a plurality of semiconductor light emitting devices 2050, as in the foregoing example.

In this case, a structure other than the rib portion 2030, the planarizing layer 2060, the phosphor layer 2080, and the solderable metal 2090 may have the same structure as the foregoing example, and thus description thereof will be replaced with the foregoing content described with reference to FIGS. 10 through 14.

According to the illustration, the rib portions 2030 are disposed at both sides of the lower wiring, and configured to protrude from one surface of the substrate 1010. The rib portion 2030 may be formed of a plurality of lines, and each line may include a pair of ribs. For example, a first rib 2031 and a second rib 2032 spaced apart from each other may constitute one line. In this case, the rib portion 2030 may be disposed such that a separation distance between the plurality of lines is greater than that between the first rib 2031 and the second rib 2032.

The first rib 2031 and the second rib 2032 may have the same height as each other with respect to the substrate, and the height of the rib portion 2030 is configured to be higher than that of the lower wiring with respect to one surface of the substrate 2010.

According to the drawing, an adhesive layer may be disposed between the substrate 2010 on which the first wiring 2020 is located and the semiconductor light emitting device 2050. The adhesive layer has a low melting point and may include a solderable metal. More specifically, the solderable metal 2090 is filled between the first rib 2031 and the second rib 2032 and configured to cover the lower wiring.

As described above, the solderable metal 2090 may be disposed to physically connect the first wiring 2020 and the semiconductor light emitting device 2050. Accordingly, the semiconductor light emitting device 2050 and the first wiring 2020 may be connected to each other for electrical conduction.

For example, the solderable metal 2090 may be formed of a material having a low melting point, and applied in the form of a dot or a line to the rib portion. In the present example, the solderable metal 2090 may be formed of a light transmitting material.

Meanwhile, according to the illustration, some of the plurality of rib portions may be formed of a light transmitting material.

For example, the plurality of rib portions 2030 includes a first rib portion 2030*a* and a second rib portion 2030*b*, and a phosphor layer 2081 covering the first rib portion 2030*a* is filled between the first rib portion 2030*a* and the second rib portion 2030*b*. At this time, among the ribs of the first rib portion 2030*a*, a rib 2032*a* close to the second rib portion 2030*b* is made of a light transmitting material. The light transmitting material is a material having a high transmittance in a visible light region, and an epoxy-based photoresist (PR), polydimethylsiloxane (PDMS), resin or the like may be used, for example. These materials are suitable for use as a material for a rib portion applied to a flexible display, since they do not have a property of being rigid at high temperatures.

More specifically, a phosphor layer 2081 is formed on an upper surface of the rib portion 2030, and the phosphor layer 2081 is filled between the semiconductor light emitting devices beyond the light-transmitting rib 2032*a* among the ribs. The phosphor layer 2081 is filled into an empty space on the left or right side with respect to the semiconductor light emitting device, and completely surrounds either one of the first rib 2031*a* and the second rib 2032*b*. In the present example, the rib 2031*a* on the left is made of a non-transmitting material, and the rib 2031*b* on the right is formed of a light transmitting material. As described above, the rib enclosed by the phosphor layer is formed of a light transmitting material to convert the wavelength of light emitted from the semiconductor light emitting device even between the semiconductor light emitting devices.

On the other hand, referring to FIG. 17, either one of the first rib 3031*a* and the second rib 3032*a* in the rib portion 3030 may be formed to transmit light, and the other one may be formed to reflect light. For such an example, a reflective layer 3033 may be formed on the rib on the left.

The reflective layer 3033 may be one or more metal thin layers formed on an edge of the rib. For example, the reflective layer 3033 are configured to cover a side surface of the rib on the left so as to reflect light. The reflective layer 3033 is formed of a metal material such as aluminum or silver having a high reflectance in a visible light region to reflect light, thereby preventing color mixture between the phosphor layers. However, the present disclosure is not necessarily limited thereto, and, for example, the reflective layer 3033 may be replaced with an oxide thin film such as TiOx or CrOx, or a distributed Bragg reflector (DBR) structure may be applicable thereto.

As described above, in the present disclosure, an area distributed with phosphor may be further secured using a transparent rib portion.

The configurations and methods according to the above-described embodiments will not be applicable in a limited way to the foregoing display apparatus using a semiconductor light emitting device, and all or part of each embodiment may be selectively combined and configured to make various modifications thereto.

What is claimed is:

1. A display apparatus, comprising:
   a substrate having a first wiring;
   a rib portion provided with a first rib and a second rib formed to protrude from one surface of the substrate, the first and second ribs disposed on opposite sides of the first wiring;
   a solderable metal filled between the first rib and the second rib, and formed to cover the first wiring;
   a plurality of semiconductor light emitting devices sequentially arranged along the rib portion; and
   a planarizing layer formed to cover the solderable metal,
   wherein at least part of the plurality of semiconductor light emitting devices are inserted into the solderable metal to be electrically connected to the first wiring,
   wherein the planarizing layer is formed to cover a top of the rib portion and the solderable metal, and
   wherein a top of the planarizing layer is formed with a flat surface.

2. The display apparatus of claim 1, further comprising:
   a second wiring electrically connected to the plurality of semiconductor light emitting devices and disposed on the planarizing layer.

3. The display apparatus of claim 2, wherein the planarizing layer is interposed between the solderable metal and the second wiring.

4. The display apparatus of claim 1, further comprising:
   a phosphor layer formed to cover the planarizing layer and the plurality of semiconductor light emitting devices to convert a wavelength of light.

5. The display apparatus of claim 4, wherein the rib portion is any one of a plurality of rib portions arranged at predetermined intervals along one direction, and the phosphor layer extends between the plurality of rib portions.

6. The display apparatus of claim 5, wherein the plurality of rib portions comprise a first rib portion and a second rib portion, and
the phosphor layer covers the first rib portion and is filled between the first rib portion and the second rib portion.

7. The display apparatus of claim 6, wherein a rib closer to the second rib portion among the first and second ribs of the first rib portion is made of a light transmitting material.

8. The display apparatus of claim 6, wherein the planarizing layer is disposed between the first rib portion and the second rib portion.

9. The display apparatus of claim 8, further comprising a black matrix,
wherein the black matrix is disposed on the planarizing layer at a location between the first rib portion and the second rib portion.

10. The display apparatus of claim 1, wherein either one of the first rib and the second rib is formed to transmit light, and the other one thereof is formed to reflect light.

11. The display apparatus of claim 1, wherein the first rib and the second rib are arranged symmetrical with respect to the plurality of semiconductor light emitting devices.

12. The display apparatus of claim 1, wherein a height of the rib portion is larger than that of the first wiring with respect to one surface of the substrate.

13. The display apparatus of claim 1, wherein the rib portion is any one of a plurality of rib portions arranged at predetermined intervals along one direction, and
an insulating material is filled between the plurality of rib portions.

14. The display apparatus of claim 13, wherein a phosphor layer for converting a wavelength of light is formed on an upper surface of the rib portion, and the phosphor layer extends to cover the insulating material.

15. The display apparatus of claim 1, wherein the first rib and the second rib are arranged parallel to each other.

16. The display apparatus of claim 1, wherein each of the plurality of semiconductor light emitting devices are a vertical semiconductor light emitting device.

17. The display apparatus of claim 1, wherein the planarizing layer contacts the substrate.

18. A display apparatus, comprising:
a substrate having a plurality of first wirings;
a plurality of ribs extending on one surface of the substrate, at least two ribs among the plurality of ribs arranged between adjacent first wirings, and at least two ribs among the plurality of ribs arranged on opposite sides of one first wiring among the plurality of first wirings;
a solderable metal filled between the at least two ribs arranged on opposites sides of the one first wiring and covering the one first wiring;
a plurality of semiconductor light emitting devices sequentially arranged along the one first wiring and within the solderable metal; and
a planarizing layer formed to cover the solderable metal, wherein the planarizing layer is formed to cover a top of the at least two ribs and the solderable metal, and
wherein a top of the planarizing layer is formed with a flat surface.

19. The display apparatus of claim 18,
wherein the planarizing layer is formed between the at least two ribs among the plurality of ribs arranged between the adjacent first wirings.

20. The display apparatus of claim 18, further comprising:
a plurality of second wirings electrically connected to the plurality of semiconductor light emitting devices, respectively.

* * * * *